United States Patent
Fujisawa

(10) Patent No.: US 8,243,534 B2
(45) Date of Patent: *Aug. 14, 2012

(54) SEMICONDUCTOR MEMORY DEVICE, MEMORY MODULE INCLUDING THE SAME, AND DATA PROCESSING SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 268 days.

This patent is subject to a terminal disclaimer.

(21) Appl. No.: 12/706,273

(22) Filed: Feb. 16, 2010

(65) Prior Publication Data

US 2010/0208534 A1    Aug. 19, 2010

(30) Foreign Application Priority Data

Feb. 17, 2009   (JP) .................................. 2009-034572

(51) Int. Cl.
*G11C 7/00* (2006.01)
(52) U.S. Cl. ........................................ 365/193; 365/194
(58) Field of Classification Search .................. 365/193, 365/194, 233.1; 326/30, 82–87; 710/5, 104, 710/105
See application file for complete search history.

(56) References Cited

U.S. PATENT DOCUMENTS

| | | | |
|---|---|---|---|
| 2003/0202409 A1* | 10/2003 | Yamaoka et al. | 365/201 |
| 2009/0115450 A1* | 5/2009 | Kim et al. | 326/30 |
| 2010/0208535 A1* | 8/2010 | Fujisawa | 365/193 |

OTHER PUBLICATIONS

XrossTalk, DDR Memory Design Challenges & Solutions, XrossTalk Magazine, Oct. 2008, pp. 4-21.
MICRON, TN-41-04 DDR3 Dynamic On-Die Termination Introduction, 2008, pp. 1-5.

* cited by examiner

*Primary Examiner* — Vu Le
(74) *Attorney, Agent, or Firm* — Sughrue Mion, PLLC

(57) ABSTRACT

To provide a semiconductor device including a skew detecting circuit activated in a write leveling mode, and an ODT control circuit that activates a terminating resistance circuit connected to a data strobe terminal by using an ODT signal. The ODT control circuit selects a first resistance mode when a dynamic ODT is in an unused state in the write leveling mode, and selects a second resistance mode when the dynamic ODT is in a used state in the write leveling mode. With this configuration, a resistance in a used state of the dynamic ODT and that in an unused state of the dynamic ODT can be reproduced in an actual write operation. Consequently, a more accurate write leveling operation can be performed.

20 Claims, 7 Drawing Sheets

| | LATENCY | | | ODT RESISTANCE | |
|---|---|---|---|---|---|
| | DQ (input) | DQS (input) | DQS (output) | IN UNUSE OF DYNAMIC ODT | IN USE OF DYNAMIC ODT |
| NOMAL OPERATION MODE (WRITE OPERATION) | AL+CWL | AL+CWL-1 | AL+CWL-2 | Rtt_Nom | Rtt_WR |
| WRITE LEVELING MODE — CONVENTIONAL | - | 0 | AL+CWL-2 | Rtt_Nom | Rtt_Nom |
| WRITE LEVELING MODE — PRESENT INVENTION | - | 0 | tAONPD tAOFPD | Rtt_Nom | Rtt_WR |

FIG.7

SEMICONDUCTOR MEMORY DEVICE, MEMORY MODULE INCLUDING THE SAME, AND DATA PROCESSING SYSTEM

BACKGROUND OF THE INVENTION

1. Field of the Invention

The present invention relates to a semiconductor device, and more particularly relates to a semiconductor device having a write leveling mode for measuring a skew between a clock signal and a data strobe signal. The present invention also relates to a module including this semiconductor device and to a data processing system.

2. Description of Related Art

Transmission and reception of read data and write data between a semiconductor memory device such as a DRAM (Dynamic Random Access Memory) and a memory controller may be performed synchronously with a data strobe signal. For example, in a write operation, a memory controller supplies a data strobe signal and write data to a semiconductor memory device, and the semiconductor memory device fetches the write data synchronously with the data strobe signal.

However, the write data fetched by the semiconductor memory device is transferred to a memory cell array synchronously with a clock signal, which is different from the data strobe signal. Therefore, when a skew exists between the data strobe signal and the clock signal, a write operation cannot be performed correctly. To solve this problem, semiconductor memory devices often include a write leveling mode for measuring the skew between a clock signal and a data strobe signal (see JEDEC STANDARD, DDR3 SDRAM Specification, JESD79-3B (Revision of JESD79-3A, September 2007), April 2008, JEDEC SOLID STATE TECHNOLOGY ASSOCIATION <URL:http://www.jedec.org/download/search/JESD79-3B.pdf>).

Note that in the present application, the disclosure of the non-patent literature mentioned above is incorporated herein by reference.

Upon entering a write leveling mode, a semiconductor memory device samples a clock signal at a timing of a rising edge of a data strobe signal supplied from a memory controller, and outputs the sampled clock signal from a data terminal. With this configuration, the memory controller can acquire an amount of skew between the data strobe signal and the clock signal. Consequently, the memory controller can adjust an output timing of the data strobe signal by taking the amount into consideration.

Because the write leveling operation mentioned above is an operation of measuring a skew between a data strobe signal and a clock signal in a write operation, it is preferable to perform the operation in the same condition as that of an actual write operation as much as possible.

Meanwhile, some semiconductor memory devices have a so-called a dynamic ODT (On Die Termination) function. According to the dynamic ODT function, it becomes possible to change a resistance of a terminating resistance circuit incorporated in a semiconductor memory device dynamically, and to change a resistance of the terminating resistance circuit to different values between that when the semiconductor memory device performs a write operation and that when another semiconductor memory device connected to the same bus performs a read operation. Therefore, when the dynamic ODT function is active, the resistance of the terminating resistance circuit changes in response to issuance of a write command.

However, because any write command is not issued during a write leveling operation, the resistance of the terminating resistance circuit is not set as a resistance when the corresponding semiconductor memory device performs a write operation, but is set as a resistance when another semiconductor memory device connected to the same bus performs a read operation. Due to this, according to a conventional semiconductor memory device, when the dynamic ODT function is active, the resistance of the terminating resistance circuit at the time of write leveling is different from that at the time of the write operation, and thus an accurate write leveling operation cannot be performed.

SUMMARY

In one embodiment, there is provided a semiconductor device that includes a clock terminal to which a clock signal is input, a data strobe terminal to which a data strobe signal that indicates an input timing of write data is input, a mode register which can be set as a normal operation mode of receiving the write data synchronously with the data strobe signal and as a write leveling mode of measuring a skew between the clock signal and the data strobe signal, a terminating resistance circuit connected to the data strobe terminal, a command terminal to which an ODT signal that designates whether to activate the terminating resistance circuit is input, a skew detecting circuit that is activated in the write leveling mode, measures a skew between the clock signal and the data strobe signal, and outputs a result of measuring, and an ODT control circuit that activates the terminating resistance circuit by using the ODT signal, wherein the mode register has a register that designates whether to use a dynamic ODT function that dynamically changes a resistance of the terminating resistance circuit, the terminating resistance circuit has a first resistance mode set as a first resistance, and a second resistance mode set as a second resistance different from the first resistance, and the ODT control circuit selects the first resistance mode when the dynamic ODT function is in an unused state in the write leveling mode, and selects the second resistance mode when the dynamic ODT function is in a used state in the write leveling mode.

In another embodiment, there is provided a module having a plurality of the semiconductor devices as described above mounted on a substrate, wherein the clock terminal provided on the semiconductor devices is flyby-connected to a same bus provided on the substrate.

In another embodiment, there is provided a data processing system comprising the module as described above and a controller connected to the module, wherein the controller causes the semiconductor devices to enter the write leveling mode by issuing the external command to the semiconductor devices in a predetermined cycle, thereby measuring a skew between the clock signal and the data strobe signal for each of the semiconductor devices, and adjusting a supply timing of the data strobe signal based on a result of measuring.

According to the semiconductor device of the present invention, a resistance of the terminating resistance circuit in the write leveling mode is changed based on whether the dynamic ODT is used. Therefore, even when a write command is not issued, a resistance in a used state of the dynamic ODT and a resistance in an unused state of the dynamic ODT can be reproduced. Accordingly, even when a semiconductor device has a dynamic ODT function, the device can perform a more accurate write leveling operation because a resistance of the terminating resistance circuit at the time of write leveling can be matched with that at the time of the write operation.

According to the module of the present invention, even when clock terminals provided in semiconductor devices are flyby-connected, a skew generated due to this configuration can be correctly adjusted.

According to the data processing system of the present invention, even when the device periodically or cyclically enters a write leveling mode during an operation after starting a system, a skew can be adjusted correctly each time.

BRIEF DESCRIPTION OF THE DRAWINGS

The above features and advantages of the present invention will be more apparent from the following description of certain preferred embodiments taken in conjunction with the accompanying drawings, in which:

FIG. 7 is a table showing latency and an ODT impedance in each operation mode.

DETAILED DESCRIPTION OF THE EMBODIMENTS

Preferred embodiments of the present invention will be explained below in detail with reference to the accompanying drawings.

Figure 1:
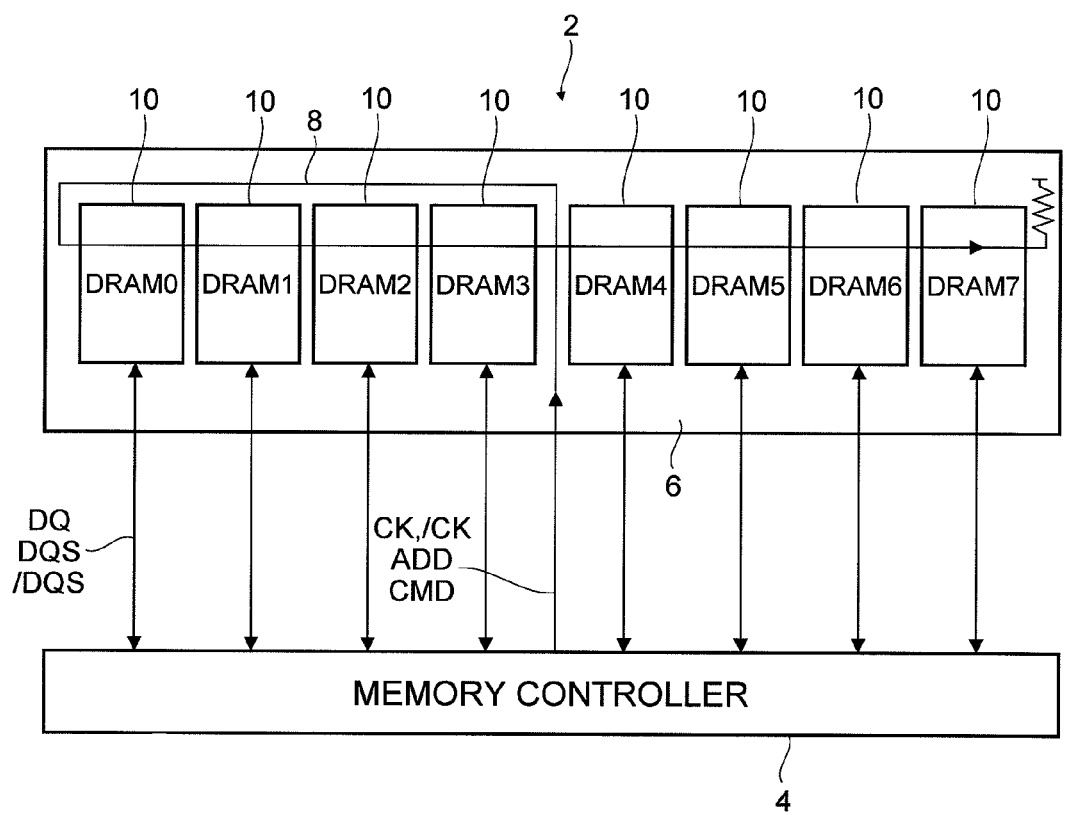
FIG. 1 is a configuration of a data processing system according to a preferred embodiment of the present invention.

FIG. 1 shows a configuration of a data processing system according to a preferred embodiment of the present invention.

The data processing system shown in FIG. 1 includes a memory module 2 and a memory controller 4 connected to the memory module 2. The memory module 2 has plural semiconductor memory devices 10 (DRAM0 to DRAM7) mounted on a module substrate 6. While the memory module 2 shown in FIG. 1 has eight DRAMs of DRAM0 to DRAM7 on the module substrate 6, the number of the semiconductor memory devices 10 mounted on the module substrate 6 is not limited thereto. The semiconductor memory devices 10 can be mounted on either one side or both sides of the module substrate 6. The structure and material of the module substrate 6 are not particularly limited.

The type of the semiconductor memory devices 10 is not also particularly limited. In the present embodiment, DDR3 (Double Data Rate 3) DRAMs are used. In the DDR3 DRAMs, a connection configuration between the memory module 2 and the memory controller 4 is changed so that the DRAMs can operate in a frequency of two times of that of DDR2 DRAMs while decreasing the voltage of a power source by about 17% of that of the DDR2 DRAMs (reduction from 1.8 V to 1.5 V).

Specifically, as shown in FIG. 1, data DQ (read data and write data) and data strobe signals DQS and /DQS are connected between the memory module 2 and the memory controller 4 in substantially equal lengths and also in a shortest distance, thereby achieving a high-speed data transfer up to 2.1 Gbps. On the other hand, clock signals CK and /CK, an address signal ADD, and a command signal CMD are flyby-connected by the same bus 8 provided on the module substrate 6. The flyby-connection means a so-called traversable connection. According to a flyby connection, the total wiring length and the number of wirings within the module substrate 6 can be reduced from those of an equidistance routing of DDR2. Consequently, a layout constraint of the bus 8 can be relaxed, and a high-quality wiring layout can be achieved. As a result, a high-speed address-command transfer up to 1.067 Gbps (DQ, half of DQS) is achieved.

However, when the flyby system is used, a skew between the data strobe signal DQS and the clock signal CK becomes greatly different depending on a mounting position of the semiconductor memory devices 10 on the module substrate 6. In the example shown in FIG. 1, a skew is the smallest in the DRAM0 nearest from the memory controller 4, and a skew is the largest in the DRAM7 furthest from the memory controller 4. Therefore, in the DRAM1 to DRAM7, when the data strobe signal DQS is output to match the skew of the DRAM0, the clock signal CK is delayed from the data strobe signal DQS, and this delay becomes the largest in the DRAM7. On the other hand, in the DRAM0 to DRAM6, when the data strobe signal DQS is output to match the skew of the DRAM7, the clock signal CK becomes faster than the data strobe signal DQS, and this advance becomes the largest in the DRAM0.

Therefore, an output timing of the data strobe signal DQS needs to be adjusted for each of the DRAM0 to DRAM7. An operation of measuring an amount of skew necessary for this adjustment is "a write leveling operation". The memory controller 4 cyclically causes the DRAM0 to DRAM7 to enter the write leveling mode in the operation after the system startup in addition to a system start time, thereby periodically monitoring a skew which changes corresponding to the operating environment such as a temperature and a power source voltage and adjusting an output timing of the data strobe signal DQS.

When the DRAM0 to DRAM7 enter the write leveling mode, the DRAM0 to DRAM7 sample the clock signal CK at a rising edge of the data strobe signal DQS supplied from the memory controller, and output it as data DQ from a data terminal. Accordingly, the memory controller 4 can acquire an amount of skew between the data strobe signal DQS and the clock signal CK, and can adjust an output timing of the data strobe signal DQS by considering the amount of skew.

Figure 2:
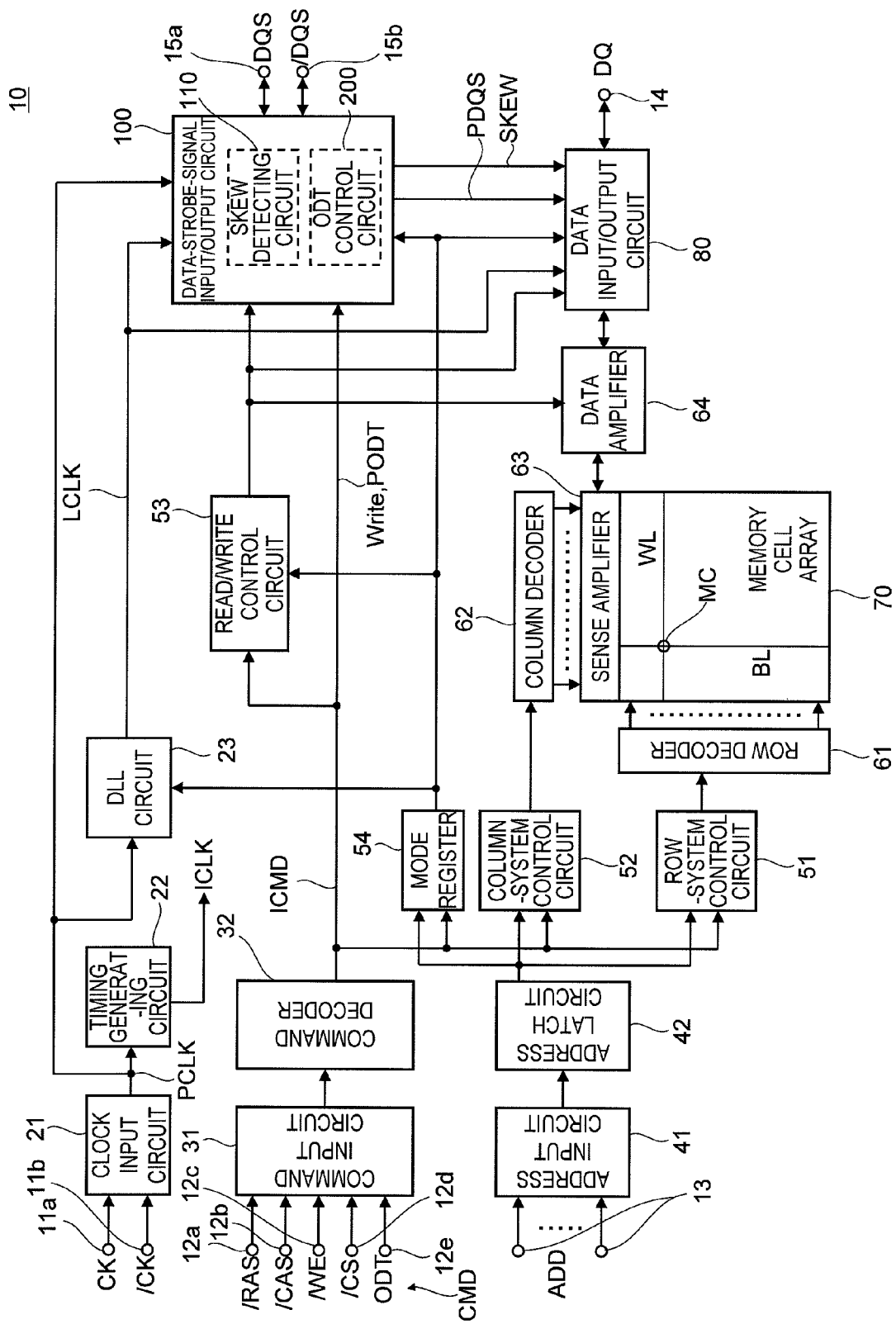
FIG. 2 is a block diagram showing a configuration of the semiconductor memory device.

FIG. 2 is a block diagram showing a configuration of the semiconductor memory device 10.

The semiconductor memory device 10 according to the present embodiment is the DDR3 DRAM as described above, and has external terminals that include clock terminals 11a and 11b, command terminals 12a to 12e, an address terminal 13, a data input/output terminal 14, and data strobe terminals 15a and 15b. While the semiconductor memory device 10 also includes a power source terminal or the like, these elements are not shown in FIG. 2.

The clock terminals 11a and 11b are supplied with the clock signals CK and /CK, respectively. The clock terminals 11a and 11b supply the received clock signals CK and /CK to a clock input circuit 21. In the present specification, a signal having "/" at the head of a signal name is an inversion signal of the corresponding signal. Therefore, the clock signals CK and /CK are mutually complimentary signals.

A clock signal, PCLK output from the clock input circuit 21 is supplied to a timing generating circuit 22, a DLL (Delay Lock Loop) circuit 23, and a data-strobe-signal input/output circuit 100. The timing generating circuit 22 generates various kinds of internal clocks ICLK, and supplies these internal clocks to various internal circuits. The DLL circuit 23 generates an output clock LCLK, and supplies the output clock LCLK to a data input/output circuit 80 and the data-strobe-signal input/output circuit 100 described later.

A phase of the clock signal PCLK substantially coincides with phases of the clock signals CK and /CK supplied from the outside. On the other hand, the output clock LCLK generated by the DLL circuit 23 is a phase-controlled signal of the clock signals CK and /CK, and a phase of the output clock LCLK is slightly advanced from those of the clock signals CK and /CK so that phases of the read data DQ and the data strobe signals DQS and /DQS coincide with the phases of the clock signals CK and /CK.

Whether to use the DLL circuit 23 is determined according to a set content to a mode register 54. That is, when "DLL on mode" is set to the mode register 54, the DLL circuit 23 is set as a used state, and the output clock LCLK is phase-controlled to the clock signals CK and /CK. On the other hand, when "DLL off mode" is set to the mode register 54, the DLL circuit 23 is set as an unused state, and the output clock LCLK is not phase-controlled to the clock signals CK and /CK. Therefore, in the DLL off mode, the output clock LCLK becomes a signal of which phase is delayed from that of the clock signal CK.

The command terminals 12a to 12e are supplied with a row-address strobe signal /RAS, a column-address strobe signal /CAS, a write enable signal /WE, a chip select signal /CS, and the ODT signal. The command terminals 12a to 12e supply the received command signals CMD to a command input circuit 31. The command input circuit 31 supplies the received command signals CMD to a command decoder 32. The command decoder 32 holds, decodes, and counts the command signals synchronously with the internal clocks ICLK, thereby generating various internal commands ICMD. The generated internal commands are supplied to a row-system control circuit 51, a column-system control circuit 52, a read/write control circuit 53, and a mode register 54. The ODT signal designates whether to activate a terminating resistance circuit described later.

The address terminal 13 is supplied with the address signals ADD. The address terminal 13 supplies the received address signals ADD to an address input circuit 41. An output of the address input circuit 41 is supplied to an address latch circuit 42. The address latch circuit 42 latches the address signals ADD synchronously with the internal clocks ICLK. Out of the address signals ADD latched by the address latch circuit 42, a row address is supplied to the row-system control circuit 51, and a column address is supplied to the column-system control circuit 52. During an entry to a mode register set, the address signals ADD are supplied to the mode register 54, thereby changing the content of the mode register 54.

An output of the row-system control circuit 51 is supplied to a row decoder 61. The row decoder 61 selects any word line WL included in a memory cell array 70. Within the memory cell array 70, plural word lines WL and plural bit lines BL cross each other, and memory cells MC are arranged at intersections of these word lines and bit lines (FIG. 2 shows only one word line WL, one bit line BL, and one memory cell MC). The bit lines BL are connected to corresponding sense amplifiers 63.

An output of the column-system control circuit 52 is supplied to the column decoder 62. The column decoder 62 selects any sense amplifier 63. The sense amplifier 63 selected by the column decoder 62 is connected to a data amplifier 64. In a read operation, the data amplifier 64 further amplifies read data amplified by the sense amplifier 63, and supplies the amplified read data to the data input/output circuit 80. On the other hand, in a write operation, the data amplifier 64 amplifies write data received from the data input/output circuit 80, and supplies this amplified write data to the sense amplifier 63. The read/write control circuit 53 controls the data amplifier 64 and the data input/output circuit 80.

The data input/output terminal (data terminal) 14 outputs the read data DQ and inputs the write data DQ, and is connected to the data input/output circuit 80. The output clock LCLK and an internal data strobe signal PDQS are supplied to the data input/output circuit 80. In the read operation, the data input/output circuit 80 outputs read data synchronously with the output clock LCLK. In the write operation, the data input/output circuit 80 fetches write data synchronously with the internal data strobe signal PDQS. In the write leveling mode, the data input/output circuit 80 receives a skew detection signal SKEW from the data-strobe-signal input/output circuit 100, and outputs this data asynchronously with the output clock LCLK.

The data strobe terminals 15a and 15b input and output the data strobe signals DQS and /DQS, respectively, and are connected to the data-strobe-signal input/output circuit 100. As shown in FIG. 2, the data-strobe-signal input/output circuit 100 includes an ODT control circuit 200. The ODT control circuit 200 activates a terminating resistance circuit (also functions as an output buffer) included in the data-strobe-signal input/output circuit 100 based on an internal ODT signal PODT and a write signal Write contained in the internal command ICMD. The internal ODT signal PODT is linked to the ODT signal. The write signal Write is activated when the command signal CMD indicates a write command. The ODT control circuit 200 is described in detail later.

The data-strobe-signal input/output circuit 100 includes a skew detecting circuit 110. The skew detecting circuit 100 detects a skew between the data strobe signal DQS and the clock signal PCLK in the write leveling mode. The skew detection signal SKEW output from the skew detecting circuit 110 is supplied to the data input/output circuit 80.

The entire configuration of the semiconductor memory device 10 according to the present embodiment is as explained above. A circuit relevant to the write leveling operation is explained in detail next.

Figure 3:
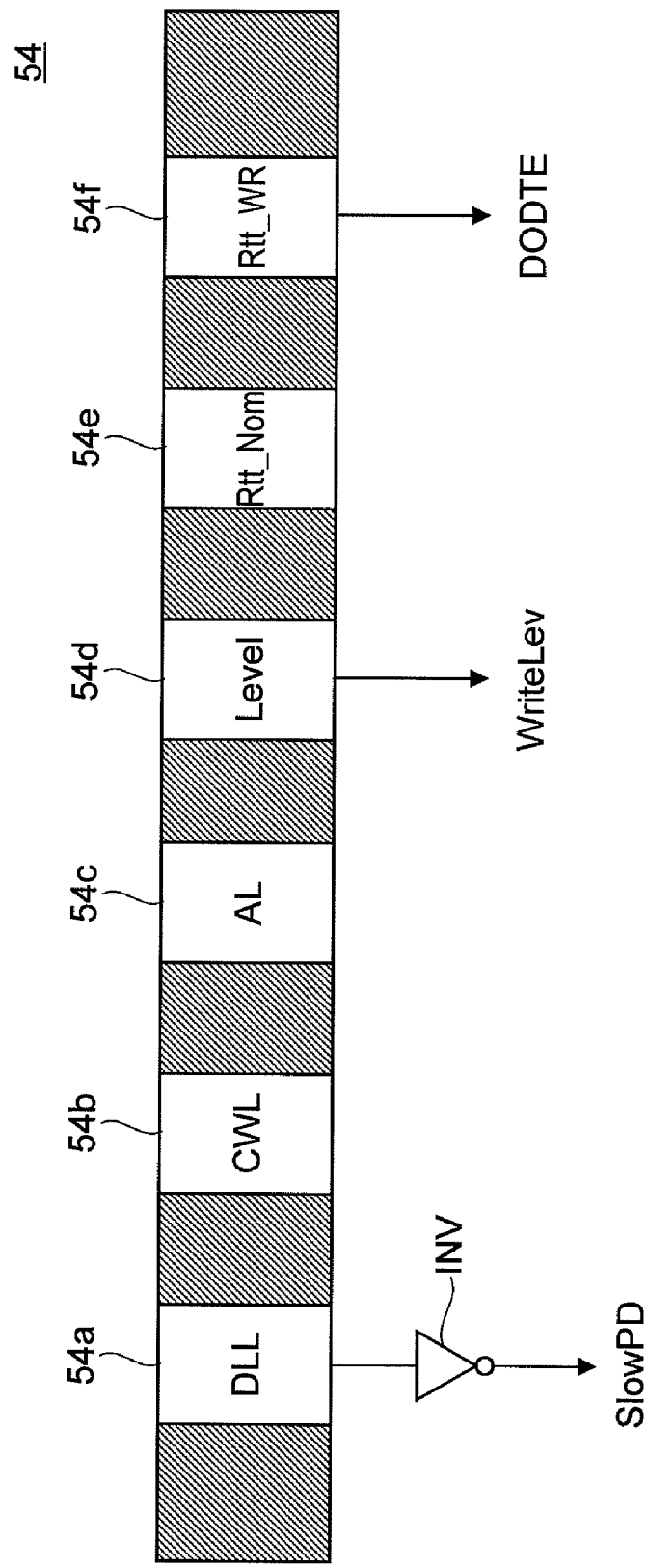
FIG. 3 shows parts of the mode register relevant to the write leveling operation.

FIG. 3 shows parts of the mode register 54 relevant to the write leveling operation.

As shown in FIG. 3, the mode register 54 includes at least registers 54a to 54f.

The register 54a designates whether the DLL circuit 23 is to be used at a precharge power down time. Specifically, when "1" is set to the register 54a, "the DLL on mode is set at the precharge power down time", and the DLL circuit 23 is used at the precharge power down time. On the other hand, when "0" is set to the register 54a, "the DLL off mode is set at the precharge power down time", and the DLL circuit 23 is not used at the precharge power down time. A set value of the register 54a is inverted by an inverter INV, and is output as an asynchronous-ODT mode signal SlowPD.

The register 54b sets CAS write latency (CWL). The CAS write latency is a clock number from when the write signal Write is activated until when write data is input.

The register 54c sets additive latency (AL). The additive latency is a clock number from when a write command is issued until when the write signal Write is activated within each semiconductor memory device 10. Therefore, the clock number from the issuance of the write command to the input of the write data DQ is defined by AL+CWL.

The register 54d sets an entrance to the write leveling mode. Specifically, when "0" is set to the register 54d, "normal operation mode" is set, and when "1" is set to the register

54d, "write leveling mode" is set. A set value of the register 54d is output as a write leveling signal WriteLev.

The register 54e sets an impedance code Rtt_Nom. The impedance code Rtt_Nom indicates a resistance when the terminating resistance circuit is operated in a first resistance mode, and indicates a terminating resistance when another semiconductor memory device 10 connected to the same bus performs a read operation. When the dynamic ODT function described later is not used, the terminating resistance circuit operates in the first resistance mode, and a resistance is set as the first resistance indicated by the impedance code Rtt_Nom even when the semiconductor memory device 10 performs a write operation.

The register 54f sets use of the dynamic ODT function and an impedance code Rtt_WR. The impedance code Rtt_WR indicates a resistance when the terminating resistance circuit is operated in a second resistance mode, and indicates a terminating resistance when a corresponding semiconductor memory device 10 performs a write operation. When the dynamic ODT function is set as a used state by a set value of the register 54f, a dynamic ODT enable signal DODTE is activated to a high level.

The dynamic ODT is a function of dynamically changing a resistance of the terminating resistance circuit. When the dynamic ODT function is active, the terminating resistance circuit becomes in the first resistance mode when another semiconductor device connected to the same bus (see FIG. 1) performs a read operation, and a resistance is set as the first resistance indicated by the impedance code Rtt_Nom. On the other hand, when a corresponding semiconductor memory device 10 performs a write operation, the terminating resistance circuit becomes in the second resistance mode, and a resistance is set as the second resistance indicated by the impedance code Rtt_RW.

A set value of the mode register 54 can be changed by inputting a desired set value via the address terminal 13 in a state that the command signal CMD indicating "mode register set (MRS)" is issued.

Figure 4:
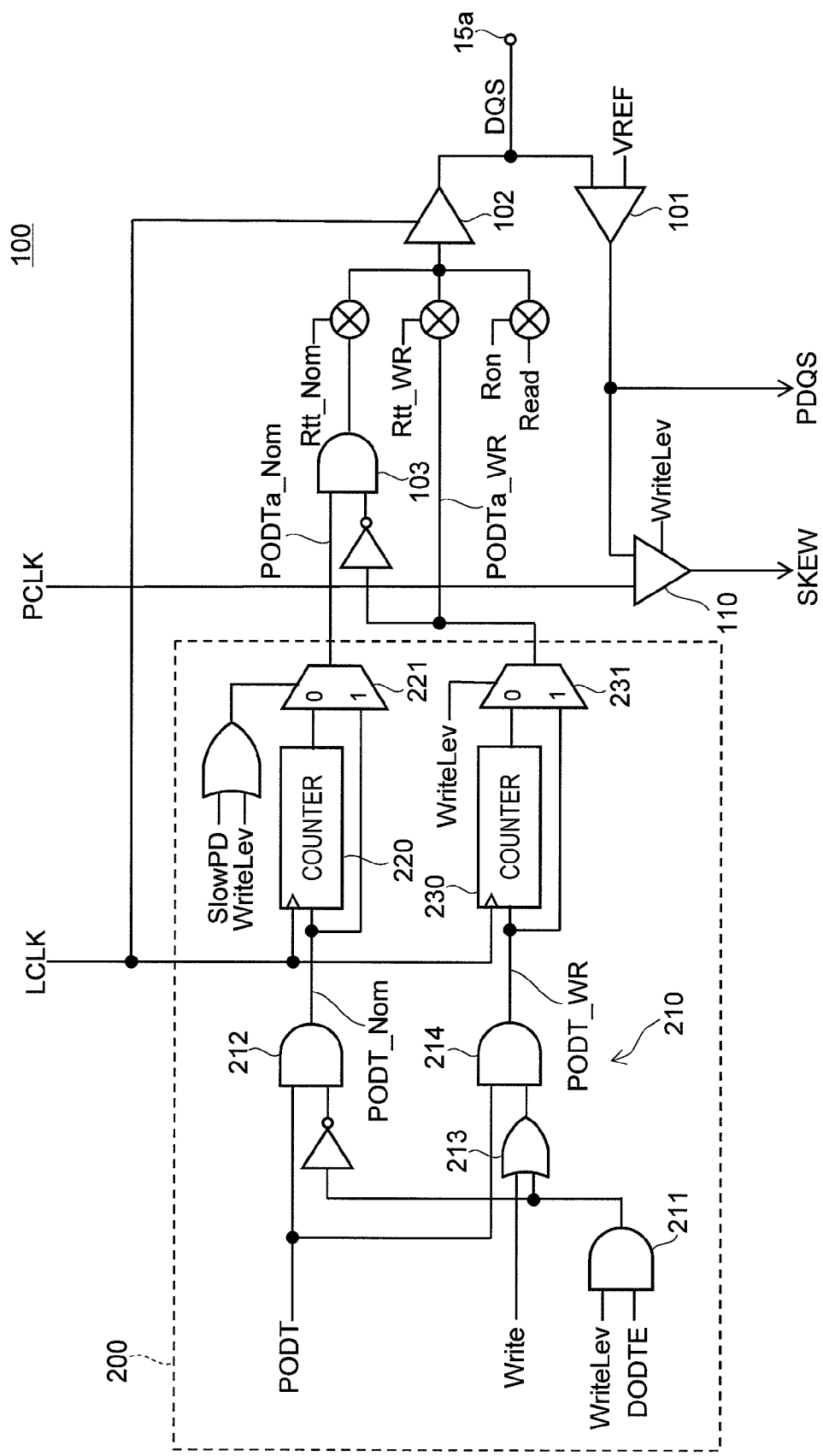
FIG. 4 is a circuit diagram showing relevant parts of the data-strobe-signal input/output circuit.

FIG. 4 is a circuit diagram showing relevant parts of the data-strobe-signal input/output circuit 100.

As shown in FIG. 4, the data-strobe-signal input/output circuit 100 includes an input receiver 101 that receives the data strobe signal DQS from the data strobe terminal 15a, and an output buffer 102 that outputs the data strobe signal DQS via the data strobe terminal 15a.

The input receiver 101 compares a level of the data strobe signal DQS with a reference potential VREF, thereby generating the internal data strobe signal PDQS. Therefore, a phase of the internal data strobe signal PDQS substantially coincides with a phase of the input data strobe signal DQS. As shown in FIG. 2, the internal data strobe signal PDQS is supplied to the data input/output circuit 80, thereby regulating an input timing of write data. The internal data strobe signal PDQS is also supplied to the skew detecting circuit 110.

The skew detecting circuit 110 is activated by the write leveling signal WriteLev, and measures a skew between the clock signal PCLK and the data strobe signal DQS. As described above, because the phase of the clock signal PCLK substantially coincides with the phase of the input clock signal CK, the skew detection signal SKEW output from the skew detecting circuit 110 accurately indicates a skew between the clock signal CK and the data strobe signal DQS. As shown in FIG. 2, the skew detection signal SKEW is supplied to the data input/output circuit 80, and is output from the data input/output terminal 14 asynchronously with the output clock LCLK.

The output buffer 102 is activated based on a read signal Read, and internal ODT signals PODTa_Nom and PODTa_WR, and is operated synchronously with the output clock LCLK. The read signal Read is supplied from the read/write control circuit 53, and the internal ODT signals PODTa_Nom and PODTa_WR are supplied from the command decoder 32.

The read signal Read is an internal signal indicating a logic level of the data strobe signal DQS to be output from the data strobe terminal 15a. During the read signal Read is operative, an impedance of the output buffer 102 is set as an impedance indicated by an impedance code Ron.

The internal ODT signal PODTa_Nom is a first control signal to use the output buffer 102 as a terminating resistance circuit. When the internal ODT signal PODTa_Nom is activated, the output buffer 102 becomes in the first resistance mode, and the impedance of the output buffer 102 is set as a first resistance indicated by the impedance code Rtt_Nom. However, even in case the internal ODT signal PODTa_Nom is activated, the internal ODT signal PODTa_Nom is interrupted by the AND circuit 103 and becomes in an inactive state when the internal ODT signal PODTa_WR is activated. The internal ODT signal PODTa_Nom is activated as in first case when the ODT signal is input from the command terminal 12e when using the dynamic ODT function and also when the write signal Write is not activated, and is activated as in second case when the ODT signal is input from the command terminal 12e when not using the dynamic ODT function.

The internal ODT signal PODTa_WR is a second control signal to use the output buffer 102 as a terminating resistance circuit. When the internal ODT signal PODTa_WR is activated, the output buffer 102 becomes in the second resistance mode, and the impedance of the output buffer 102 is set as a second resistance indicated by the impedance code Rtt_WR. The internal ODT signal PODTa_WR is activated when the ODT signal is input from the command terminal 12e when using the dynamic ODT function and also when the write signal Write is activated.

As explained above, the output buffer 102 functions to output the read signal Read from the data strobe terminal 15a, and functions as a terminating resistance circuit.

As shown in FIG. 4, the ODT control circuit 200 has a gate circuit 210 that receives the internal ODT signal PODT, the write signal Write, the write leveling signal WriteLev, and the dynamic ODT enable signal DODTE, and generates the internal ODT signals PODT_Nom and PODT_WR. The write leveling signal WriteLev is activated when the semiconductor memory device enters the write leveling mode, and this signal is supplied from the mode register 54. The dynamic ODT enable signal DODTE is activated when the dynamic ODT function is active, and this signal is supplied from the mode register 54.

The above configuration is explained in detail. The gate circuit 210 includes an AND circuit 211 that receives the write leveling signal WriteLev, and the dynamic ODT enable signal DODTE, an AND circuit 212 that receives the internal ODT signal PODT and an inverted output of the AND circuit 211, an OR circuit 213 that receives the write signal Write and an output of the AND circuit 211, and an AND circuit 214 that receives the internal ODT signal PODT and an output of the OR circuit 213.

In the above circuit configuration, the internal ODT signal PODT_Nom is activated to a high level when the internal ODT signal PODT is at a high level (an active state) and also when at least one of the write leveling signal WriteLev and the dynamic ODT enable signal DODTE is at a low level (an inactive state). On the other hand, the internal ODT signal PODT_WR is activated to a high level when the internal ODT signal PODT is at a high level (an active state) and also when either the write signal Write is at a high level (an active state) or both the write leveling signal WriteLev and the dynamic ODT enable signal DODTE are at a high level (an active state).

The internal ODT signals PODT_Nom and PODT_WR generated by the gate circuit 210 are supplied to counters 220 and 230, respectively. The counters 220 and 230 count the output clock LCLK for a predetermined number of times, thereby delaying the internal ODT signals PODT_Nom and PODT_WR, respectively. Numbers of count by the counters 220 and 230 are determined by the CAS write latency (CWL) and the additive latency (AL) set in the mode register 54.

Outputs of the counters 220 and 230 are supplied to multiplexers 221 and 231, respectively. The internal ODT signals PODT_Nom and PODT_WR having bypassed the counters 220 and 230 are also directly supplied to the multiplexers 221 and 231, respectively, and any one of these signals is selected. The selected signal becomes the internal ODT signal PODTa_Nom or PODTa_WR, and makes the impedance code Rtt_Nom or Rtt_WR active.

The selection of the multiplexer 221 is determined by a logical sum output of the asynchronous-ODT mode signal SlowPD and the write leveling signal WriteLev. Specifically, when both the asynchronous-ODT mode signal SlowPD and the write leveling signal WriteLev are at a low level (an inactive state), a 0-side input of the multiplexer 221 is selected. As a result, the internal ODT signal PODT_Nom having passed the counter 220 is output as the internal ODT signal PODTa_Nom. On the other hand, when at least one of the asynchronous-ODT mode signal SlowPD and the write leveling signal WriteLev is at a high level (an active state), a 1-side input of the multiplexer 221 is selected. As a result, the internal ODT signal PODT_Nom having bypassed the counter 220 is directly output as the internal ODT signal PODTa_Nom.

The selection of the multiplexer 231 is determined by the write leveling signal WriteLev. Specifically, when the write leveling signal WriteLev is at a low level (an inactive state), a 0-side input of the multiplexer 231 is selected. As a result, the internal ODT signal PODT_WR having passed the counter 230 is output as the internal ODT signal PODTa_WR. On the other hand, when the write leveling signal WriteLev is at a high level (an active state), a 1-side input of the multiplexer 231 is selected. As a result, the internal ODT signal PODT_WR having bypassed the counter 230 is directly output as the internal ODT signal PODTa_WR.

Based on the above configuration, in the normal operation mode, the internal ODT signals PODT_Nom and PODT_WR delayed by the counters 220 and 230 are selected. On the other hand, in the write leveling mode, the internal ODT signals PODT_Nom and PODT_WR having bypassed the counters 220 and 230 are selected.

The configuration of the semiconductor memory device 10 according to the present embodiment is as explained above. An operation of the semiconductor memory device 10 according to the present embodiment is explained next.

Figure 5:
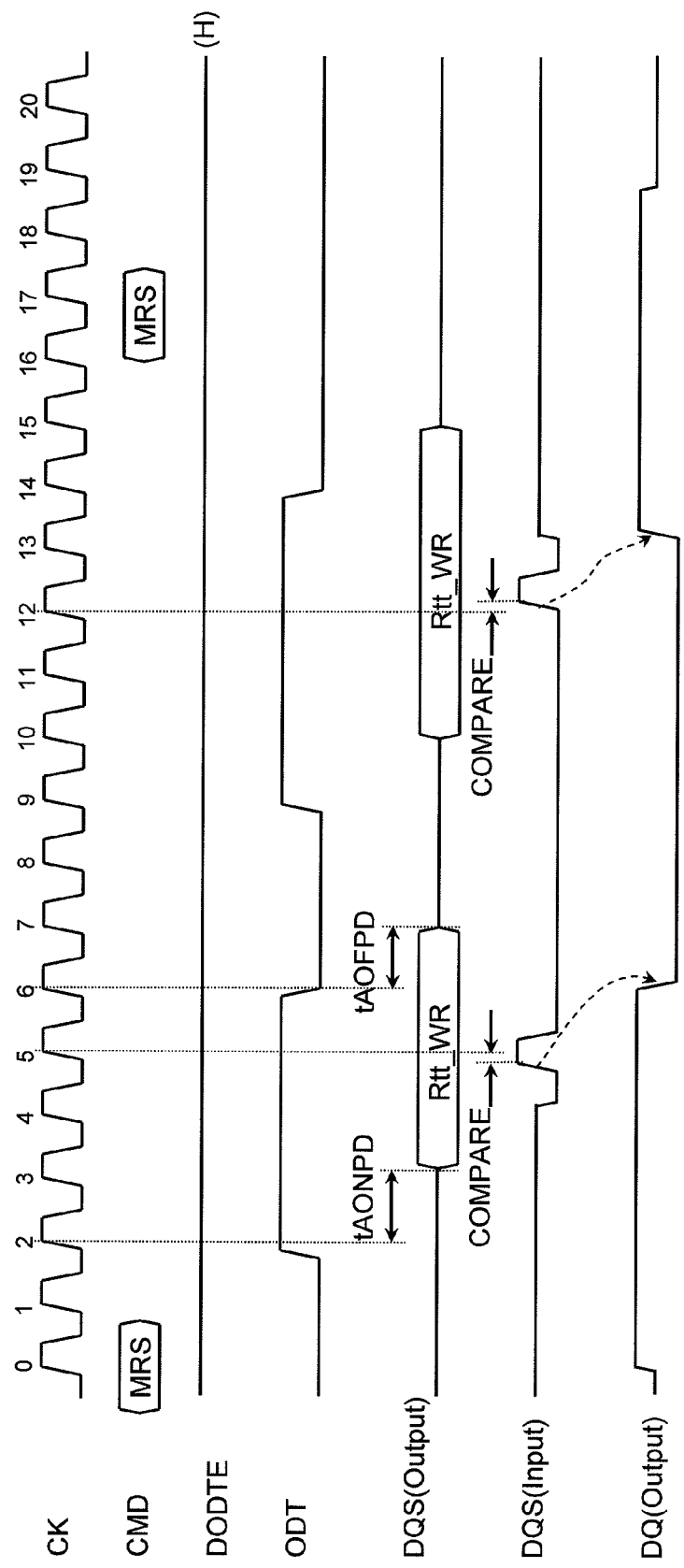
FIG. 5 is a timing diagram showing an operation of the semiconductor memory device in the write leveling mode when the dynamic ODT function is active.

FIG. 5 is a timing diagram showing an operation of the semiconductor memory device 10 according to the present embodiment in the write leveling mode. FIG. 5 shows an example of an operation when the dynamic ODT function is active (DODTE=H).

In the example shown in FIG. 5, a mode register command (MRS) is issued synchronously with an active edge 0 of the clock signal CK. Accordingly, the semiconductor memory device enters the write leveling mode. In this example, because the dynamic ODT function is active, both the write leveling signal WriteLev and the dynamic ODT enable signal DODTE become at a high level. Accordingly, the output of the OR circuit 213 shown in FIG. 4 becomes at a high level forcibly.

When the ODT signal is activated synchronously with an active edge 2 of the clock signal CK, the internal ODT signal PODT is activated. At this time, although the write signal Write for the write leveling mode is not activated because the output of the OR circuit 213 is already at a high level, the internal ODT signal PODT_WR is activated. Because the internal ODT signal PODT_WR is immediately supplied to the output buffer 102 bypassing the counter 230, a terminating resistance of the output buffer 102 is set as the second resistance indicated by the impedance code Rtt_WR in a minimum time tAONPD. That is, the second resistance mode is immediately set.

A state that the output buffer 102 becomes in the second resistance mode is in the same condition as that in a write operation when the dynamic ODT function is active. Therefore, a skew when the dynamic ODT function is active can be correctly reproduced. In the example shown in FIG. 5, the data strobe signal DQS is started from the memory controller 4, and a phase comparison with the active edge 5 of the corresponding clock signal CK is performed. The skew detecting circuit 110 shown in FIG. 4 performs this phase comparison. Accordingly, the skew detection signal SKEW is generated, and the data input/output circuit 80 outputs the read data DQ asynchronously with the output clock LCLK.

Thereafter, when the ODT signal is inactivated synchronously with an active edge 6 of the clock signal CK, a terminating resistance of the output buffer 102 returns to the high impedance state in a minimum time tAOFPD. When the output buffer 102 becomes in a high impedance state, power consumption of the output buffer 102 becomes substantially zero.

Figure 6:
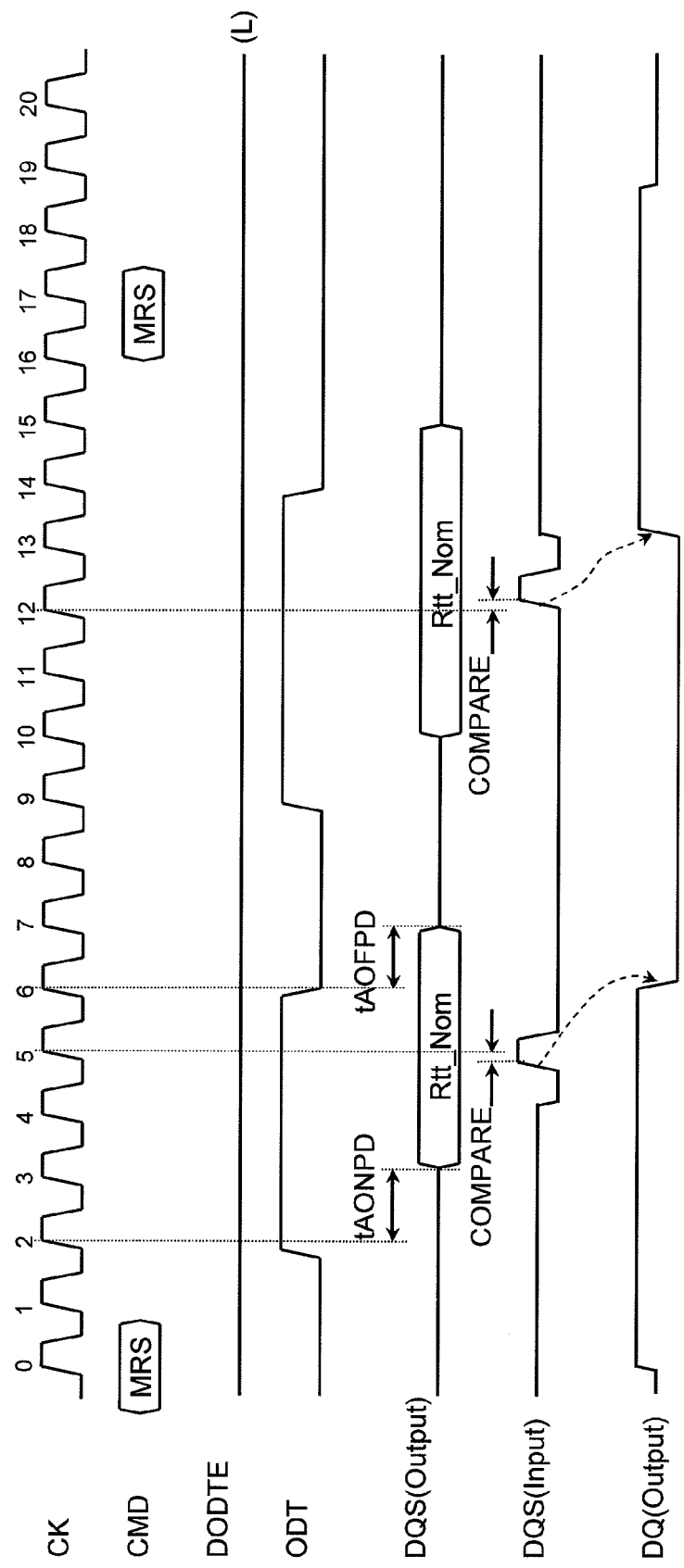
FIG. 6 is a timing diagram showing an operation of the semiconductor memory device in the write leveling mode when the dynamic ODT function is inactive.

FIG. 6 is another timing diagram showing an operation of the semiconductor memory device 10 according to the present embodiment in the write leveling mode. FIG. 6 shows an example of an operation when the dynamic ODT function is inactive (DODTE=L).

Operation timings shown in FIG. 6 are basically the same as the operation timings shown in FIG. 5. However, in the example of FIG. 6, because the dynamic ODT function is inactive (inoperative), even when the internal ODT signal PODT is activated, the internal ODT signal PODT_WR is not activated, and the internal ODT signal PODT_Nom is activated instead. Because the internal ODT signal PODT_Nom is supplied to the output buffer 102 immediately after bypassing the counter 220, a terminating resistance of the output buffer 102 is set as the first resistance indicated by the impedance code Rtt_Nom in the minimum time tAONPD. That is the first resistance mode is set immediately.

A state that the output buffer 102 becomes in the first resistance mode is in the same condition as that in a write operation when the dynamic ODT function is inactive. Therefore, a skew when the dynamic ODT function is inactive can be correctly reproduced.

Thereafter, when the ODT signal is inactivated synchronously with the active edge 6 of the clock signal CK, a terminating resistance of the output buffer 102 becomes in the high impedance state in the minimum time tAOFPD.

FIG. 7 is a table showing latency and an ODT impedance in each operation mode.

As shown in FIG. 7, input latency of the write data DQ is "AL+CWL" in a write operation in the normal operation mode. The data strobe signal DQS is input earlier by a write preamble period (1tCK). That is, latency of the data strobe signal DQS is "AL+CWL−1". This is because operation speed of a DRAM core does not significantly improve, latency (AL+CL) in a read operation needs to be increased following speeding-up of an operation frequency. When latency in a write operation is not simultaneously increased accordingly, the data strobe signal DQS and the read/write data DQ collide during a period of write to read or read to write. Therefore, to simultaneously input a write command and the ODT signal, operation latency (ODT latency) of the terminating resistance circuit to the ODT signal is set as "AL+CWL−2".

On the other hand, input of a read command is not necessary in the write leveling mode. Therefore, input latency of the data strobe signal DQS is 0. Consequently, ODT latency can be also 0. However, according to the conventional semiconductor memory device, there is no route to bypass the ODT signal. Therefore, a lapse of the same ODT latency (=AL+CWL−2) as that in the write operation needs to be awaited.

On the other hand, according to the present embodiment, the ODT signal is bypassed in the write leveling mode as explained above. Therefore, the terminating resistance circuit can be activated in the minimum time tAONPD after activating the ODT signal, and the terminating resistance circuit can be inactivated in the minimum time tAONPD after inactivating the ODT signal.

In the write leveling mode, a write command is not issued. Therefore, according to the conventional semiconductor memory device, a terminating resistance in the write leveling mode is fixed to the first resistance indicated by the impedance code Rtt_Nom.

On the other hand, as already explained, according to the present embodiment, when the dynamic ODT function is used in the write leveling mode, a terminating resistance can be set as the second resistance indicated by the impedance code Rtt_WR.

As explained above, according to the present embodiment, because the counters 220 and 230 are bypassed in the write leveling mode, the output buffer 102 can be caused to function as a terminating resistance circuit immediately after responding to a change of the ODT signal. Therefore, unlike in the conventional semiconductor memory device, a lapse of the ODT latency does not need to be awaited until when the terminating resistance circuit is activated in the write leveling mode, and the semiconductor memory device of the present embodiment can perform a write leveling operation at high speed. As a result, even when the semiconductor memory device periodically or cyclically enters the write leveling mode in the operation after a system startup, reduction of performance of the system can be minimized.

Further, according to the present embodiment, because a resistance of the terminating resistance circuit is changed over corresponding to whether to use the dynamic ODT function, a used state and an unused state of the dynamic ODT function in the normal operation mode can be correctly reproduced in the write leveling mode. Consequently, a skew can be measured accurately, and a write leveling operation can be performed in high precision.

While an exemplary embodiment has been explained above, the present invention is not limited thereto. Various modifications of the embodiment can be made without departing from the scope of the present invention, and these modifications are also embraced within the range of the invention.

For example, in the above embodiment, while application of the present invention to a DRAM has been explained, an application target of the invention is not limited to a nonvolatile memory. The present invention can be also applied to other types of semiconductor memory devices such as a nonvolatile memory like a PRAM (phase change memory).

In the above embodiment, while the counters 220 and 230 are operated by using the output clock LCLK which is phase-controlled by the DLL circuit, use of an internal-clock generating circuit such as the DLL circuit is not essential in the present invention. Therefore, the ODT signal can be delayed by counting an external clock instead of an internal clock.

In the above embodiment, while the output buffer 102 constitutes a terminating resistance circuit, it is not essential that the terminating resistance circuit also functions as an output buffer of the present invention. Therefore, the output buffer and the terminating resistance circuit can be separate circuits.

Further, in the above embodiment, while the counters 220 and 230 that delay the ODT signal are bypassed in the write leveling mode, bypassing the counters 220 and 230 is not essential in the present invention. In addition, provision of counters to delay the ODT signal is not essential either.

According to the present invention, This invention can be incorporated in semiconductor devices of various main functions. That is, the present invention can be applied to semiconductor related products such as a CPU (Central Processing Unit), an MCU (Micro Control Unit), a DSP (Digital Signal Processor), an ASIC (Application Specific Integrated Circuit), an ASSP (Application Specific Standard Circuit), each including a semiconductor memory unit (portion) including features of the appended claims. Devices to which the present invention is applied can be applicable to semiconductor devices such as an SOC (System on Chip), an MCP (Multi Chip Package), a POP (Package on Package). Furthermore, it suffices that the transistor used in a memory cell and a logic circuit is an FET (Field Effect Transistor), and the transistor can be also applied to various FETs such as an MIS (Metal-Insulator Semiconductor) and a TFT (Thin Film Transistor) in addition to an MOS (Metal Oxide Semiconductor). Some of the transistors can be those other than an FET. A P-channel transistor or a PMOS transistor constituting a so-called CMOS logic circuit is an example of a first-conductivity transistor, and an N-channel transistor or an NMOS transistor is an example of a second-conductivity transistor. Further, in addition to a P-type semiconductor substrate, the transistor can be an N-type semiconductor substrate, a semiconductor substrate of an SOI (Silicon on Insulator) structure, or other types of semiconductor substrate.

What is claimed is:

1. A semiconductor device comprising:
   a clock terminal to which a clock signal is supplied;
   a data strobe terminal to which a data strobe signal that indicates an input timing of write data is supplied;
   a mode register which can be set as a normal operation mode of receiving the write data synchronously with the data strobe signal and as a write leveling mode of measuring askew between the clock signal and the data strobe signal;
   a terminating resistance circuit connected to the data strobe terminal;
   a command terminal to which an ODT (On-Die Termination) signal that designates whether to activate the terminating resistance circuit is supplied;
   a skew detecting circuit that is activated in the write leveling mode, measures a skew between the clock signal and the data strobe signal, and outputs a result of measuring; and
   an ODT control circuit that activates the terminating resistance circuit based on the ODT signal, wherein the mode register has a register that designates whether to use a dynamic ODT function that dynamically changes a resistance of the terminating resistance circuit, the terminating resistance circuit has a first resistance mode set as a first resistance, and a second resistance mode set as a second resistance different from the first resistance, and the ODT control circuit selects the first resistance mode when the dynamic ODT function is in an unused state in the write leveling mode, and selects the second resistance mode when the dynamic ODT function is in a used state in the write leveling mode.

2. The semiconductor device as claimed in claim 1, wherein in case the dynamic ODT function is in a used state in the normal operation mode, the ODT control circuit selects the first resistance mode when another semiconductor device connected to the semiconductor device via a same bus performs a read operation, and selects the second resistance mode when another semiconductor device performs a write operation.

3. The semiconductor device as claimed in claim 1, wherein the first and second resistances are determined by a set value of the mode register.

4. The semiconductor device as claimed in claim 2, wherein the first and second resistances are determined by a set value of the mode register.

5. The semiconductor device as claimed in claim 1, further comprising a data terminal to which the write data is supplied, wherein the skew detecting circuit outputs a measured result of the skew to outside via the data terminal.

6. The semiconductor device as claimed in claim 2, further comprising a data terminal to which the write data is supplied, wherein the skew detecting circuit outputs a measured result of the skew to outside via the data terminal.

7. The semiconductor device as claimed in claim 3, further comprising a data terminal to which the write data is supplied, wherein the skew detecting circuit outputs a measured result of the skew to outside via the data terminal.

8. The semiconductor device as claimed in claim 4, further comprising a data terminal to which the write data is supplied, wherein the skew detecting circuit outputs a measured result of the skew to outside via the data terminal.

9. The semiconductor device as claimed in claim 1, wherein the ODT control circuit includes a counter circuit that delays the ODT signal by counting the clock signal or an internal clock signal synchronous with the clock signal for a predetermined number of times, and activates the terminating resistance circuit by using the ODT signal having passed the counter circuit in the normal operation mode.

10. The semiconductor device as claimed in claim 2, wherein the ODT control circuit includes a counter circuit that delays the ODT signal by counting the clock signal or an internal clock signal synchronous with the clock signal for a predetermined number of times, and activates the terminating resistance circuit by using the ODT signal having passed the counter circuit in the normal operation mode.

11. The semiconductor device as claimed in claim 3, wherein the ODT control circuit includes a counter circuit that delays the ODT signal by counting the clock signal or an internal clock signal synchronous with the clock signal for a predetermined number of times, and activates the terminating resistance circuit by using the ODT signal having passed the counter circuit in the normal operation mode.

12. The semiconductor device as claimed in claim 4, wherein the ODT control circuit includes a counter circuit that delays the ODT signal by counting the clock signal or an internal clock signal synchronous with the clock signal for a predetermined number of times, and activates the terminating resistance circuit by using the ODT signal having passed the counter circuit in the normal operation mode.

13. The semiconductor device as claimed in claim 5, wherein the ODT control circuit includes a counter circuit that delays the ODT signal by counting the clock signal or an internal clock signal synchronous with the clock signal for a predetermined number of times, and activates the terminating resistance circuit by using the ODT signal having passed the counter circuit in the normal operation mode.

14. The semiconductor device as claimed in claim 9, wherein the number of count by the counter circuit is determined by a set value of the mode register.

15. The semiconductor device as claimed in claim 9, further comprising a DLL (Delay Locked Loop) circuit that generates the internal clock signal synchronous with the clock signal, wherein the counter circuit included in the ODT control circuit delays the ODT signal by counting the internal clock signal for a predetermined number of times.

16. The semiconductor device as claimed in claim 15, wherein whether to use the DLL circuit is determined by a set value of the mode register, and the ODT control circuit activates the terminating resistance circuit by using the ODT signal having bypassed the counter circuit, in case the DLL circuit is not used.

17. The semiconductor device as claimed in claim 1, wherein the terminating resistance circuit also functions as an output buffer that outputs a data strobe signal that indicates an output timing of read data.

18. The semiconductor device as claimed in claim 1, wherein the semiconductor device enters the write leveling mode in response to an external command issued in a predetermined cycle.

19. A module having a plurality of semiconductor devices mounted on a substrate, each of the semiconductor devices comprising:

a clock terminal to which a clock signal is supplied;

a data strobe terminal to which a data strobe signal that indicates an input timing of write data is supplied;

a mode register which can be set as a normal operation mode of receiving the write data synchronously with the data strobe signal and as a write leveling mode of measuring askew between the clock signal and the data strobe signal;

a terminating resistance circuit connected to the data strobe terminal;

a command terminal to which an ODT (On-Die Termination) signal that designates whether to activate the terminating resistance circuit is supplied;

a skew detecting circuit that is activated in the write leveling mode, measures a skew between the clock signal and the data strobe signal, and outputs a result of measuring; and an ODT control circuit that activates the terminating resistance circuit based on the ODT signal, wherein the mode register has a register that designates whether to use a dynamic ODT function that dynamically changes a resistance of the terminating resistance circuit, the terminating resistance circuit has a first resistance mode set as a first resistance, and a second resistance mode set as a second resistance different from the first resistance, the ODT control circuit selects the first resistance mode when the dynamic ODT function is in an unused state in the write leveling mode, and selects the second resistance mode when the dynamic ODT function is in a used state in the write leveling mode, and the clock terminal provided on each of the semiconductor devices is connected to a same bus provided on the substrate in a manner of traversable connection.

20. A data processing system comprising a module that includes a plurality of semiconductor devices mounted on a substrate and a controller connected to the module, each of the semiconductor devices comprising:

a clock terminal to which a clock signal is supplied;

a data strobe terminal to which a data strobe signal that indicates an input timing of write data is supplied;

a mode register which can be set as a normal operation mode of receiving the write data synchronously with the data strobe signal and as a write leveling mode of measuring askew between the clock signal and the data strobe signal;

a terminating resistance circuit connected to the data strobe terminal;

a command terminal to which an ODT (On-Die Termination) signal that designates whether to activate the terminating resistance circuit is supplied;

a skew detecting circuit that is activated in the write leveling mode, measures a skew between the clock signal and the data strobe signal, and outputs a result of measuring; and an ODT control circuit that activates the terminating resistance circuit based on the ODT signal, wherein the mode register has a register that designates whether to use a dynamic ODT function that dynamically changes a resistance of the terminating resistance circuit, the terminating resistance circuit has a first resistance mode set as a first resistance, and a second resistance mode set as a second resistance different from the first resistance, the ODT control circuit selects the first resistance mode when the dynamic ODT function is in an unused state in the write leveling mode, and selects the second resistance mode when the dynamic ODT function is in a used state in the write leveling mode, the clock terminal provided on each of the semiconductor devices is connected to a same bus provided on the substrate in a manner of traversable connection, and the controller causes the semiconductor devices to enter the write leveling mode by issuing the external command to the semiconductor devices in a predetermined cycle, thereby measuring a skew between the clock signal and the data strobe signal for each of the semiconductor devices, and adjusting a supply timing of the data strobe signal based on a result of measuring.

* * * * *